(12) United States Patent
Shin (10) Patent No.: US 10,197,841 B2
(45) Date of Patent: Feb. 5, 2019

(54) LIQUID CRYSTAL DISPLAY DEVICE AND METHOD OF MANUFACTURING THE SAME

(71) Applicant: LG DISPLAY CO., LTD., Seoul (KR)

(72) Inventor: MinChul Shin, Jeollanam-do (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 14/981,148

(22) Filed: Dec. 28, 2015

(65) Prior Publication Data

US 2016/0187718 A1 Jun. 30, 2016

(30) Foreign Application Priority Data

Dec. 29, 2014 (KR) .......................... 10-2014-0192380

(51) Int. Cl.
*G02F 1/1333* (2006.01)
*G02F 1/1335* (2006.01)
*H01L 27/12* (2006.01)
*G02F 1/1362* (2006.01)

(52) U.S. Cl.
CPC .. *G02F 1/133512* (2013.01); *G02F 1/136204* (2013.01); *H01L 27/1262* (2013.01); *G02F 2001/133334* (2013.01); *G02F 2001/133388* (2013.01)

(58) Field of Classification Search
CPC ............... G02F 2001/133334; G02F 1/133512
See application file for complete search history.

(56) References Cited

U.S. PATENT DOCUMENTS

| 7,050,131 | B2 | 5/2006 | Choi et al. |
| 2004/0017526 | A1 | 1/2004 | Kuo |
| 2004/0075801 | A1 | 4/2004 | Choi et al. |
| 2005/0134764 | A1 | 6/2005 | Jeoung et al. |
| 2009/0303427 | A1 | 12/2009 | Kondo et al. |
| 2011/0183451 | A1 | 7/2011 | Tanaka et al. |
| 2011/0242469 | A1* | 10/2011 | Kawamura ....... G02F 1/133512 349/138 |
| 2012/0229736 | A1 | 9/2012 | Osaki et al. |
| 2012/0231566 | A1 | 9/2012 | Oh et al. |

FOREIGN PATENT DOCUMENTS

| JP | 2008-46277 A | 2/2008 |
| JP | 2011-170134 A | 9/2011 |
| JP | 2011-215402 A | 10/2011 |
| KR | 10-1298610 B1 | 8/2013 |
| WO | WO 2006/098475 A1 | 9/2006 |
| WO | WO 2011/062009 A1 | 5/2011 |

* cited by examiner

*Primary Examiner* — Phu Vu
(74) *Attorney, Agent, or Firm* — Birch, Stewart, Kolasch & Birch, LLP (57) ABSTRACT

A liquid crystal display (LCD) device and a method of manufacturing the same are discussed. The LCD device according to an embodiment includes a first substrate and a second substrate bonded to each other, an inner black matrix and an outer black matrix disposed in the bezel area of the second substrate to be spaced apart from each other, and a liquid crystal layer disposed between the first substrate and the second substrate. A display area and a bezel area surrounding the display area are defined in the first substrate and the second substrate.

15 Claims, 7 Drawing Sheets

LIQUID CRYSTAL DISPLAY DEVICE AND METHOD OF MANUFACTURING THE SAME

CROSS-REFERENCE TO RELATED APPLICATION

Pursuant to 35 U.S.C. § 119(a), this application claims the benefit of earlier filing date and right of priority to Korean Application No. 10-2014-0192380, filed on Dec. 29, 2014, the contents of which is incorporated by reference herein in its entirety.

BACKGROUND OF THE DISCLOSURE

Field of the Disclosure

The present disclosure relates to a liquid crystal display (LCD) device, and particularly, to an LCD device for preventing surge static electricity from flowing into a liquid crystal panel and a method of manufacturing the same.

Background of the Disclosure

Generally, in LCD devices, a liquid crystal display panel where a plurality of liquid crystal cells are arranged in a matrix type displays an image corresponding to a video signal by adjusting a light transmittance of each of the liquid crystal cells according to the video signal.

The LCD devices each include a liquid crystal display panel, where a plurality of liquid crystal cells are arranged in a matrix type, and a plurality of driving circuits for driving the liquid crystal display panel.

Figure 1:
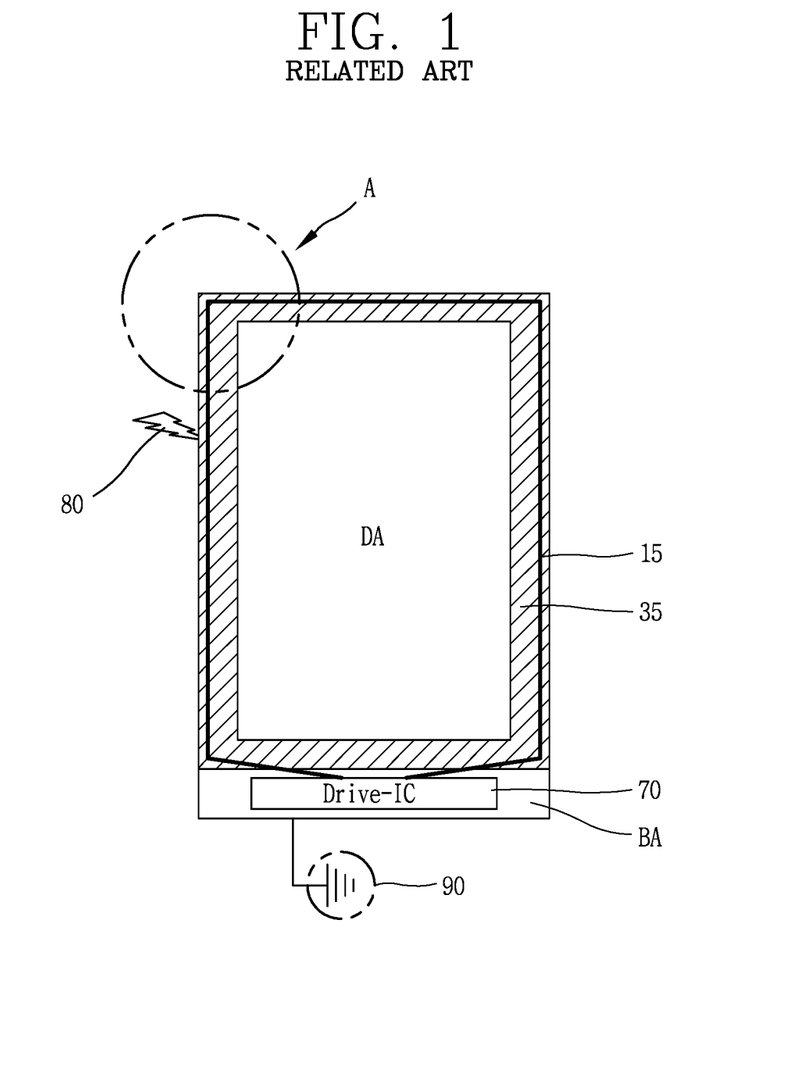
FIG. 1 is a schematic plan view of a related art LCD device.
Figure 2:
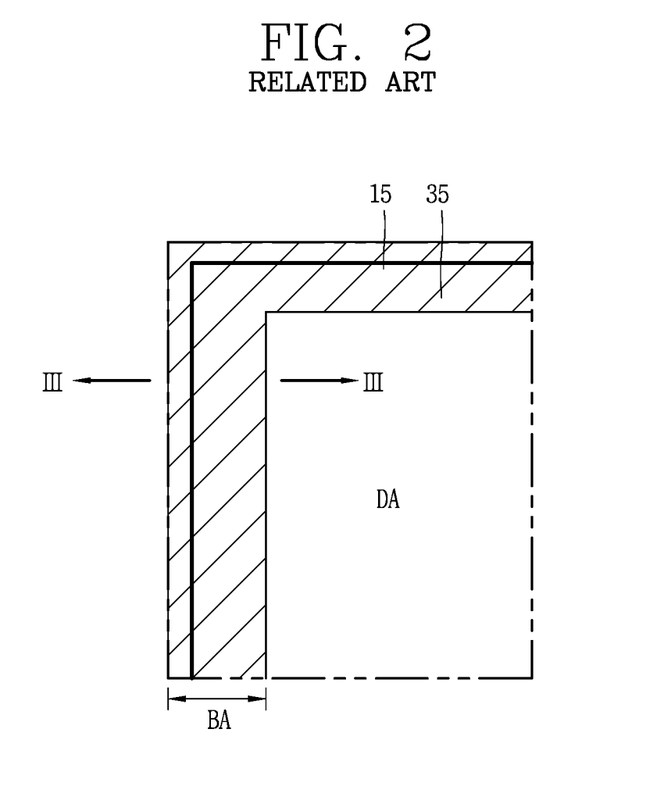
FIG. 2 is an enlarged plan view of a portion A of FIG. 1.
Figure 3:
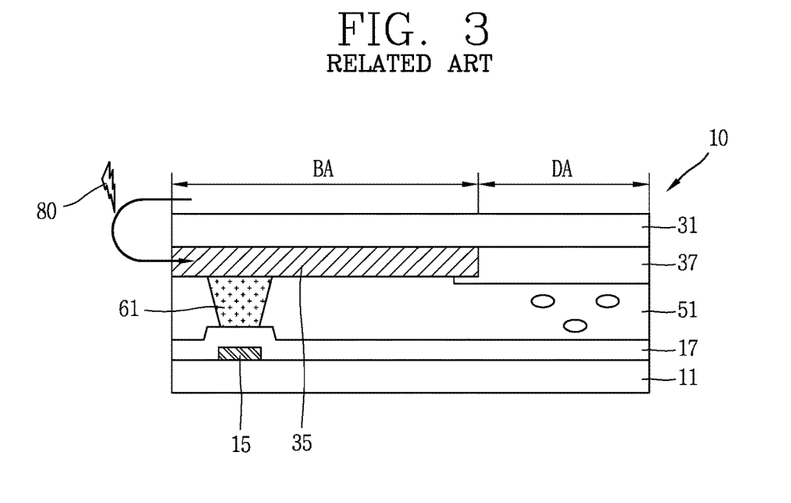
FIG. 3 is a cross-sectional view taken along line III-III of FIG. 2 and is a schematic plan view of the related art LCD device.

FIG. 1 is a schematic plan view of a related art LCD device, FIG. 2 is an enlarged plan view of a portion A of FIG. 1, and FIG. 3 is a cross-sectional view taken along line III-III of FIG. 2 and is a schematic plan view of the related art LCD device.

The related art LCD device, as illustrated in FIGS. 1 and 2, includes a display area and a bezel area BA disposed outside the display area DA.

The related art LCD device, as illustrated in FIG. 3, includes a liquid crystal display panel 10 where a plurality of liquid crystal cells are arranged in an active matrix type and a plurality of driving circuits 70 for driving the liquid crystal display panel 10.

The liquid crystal display panel 10 includes a first substrate 11, where a thin film transistor (TFT) array is formed, and a second substrate 31 where a color filter array is formed. The first substrate 11 is bonded to the second substrate 31 to maintain a uniform cell gap, and a liquid crystal layer 51 is formed in the cell gap between the first substrate 11 and the second substrate 31.

Moreover, a plurality of data lines to which image information is applied and a plurality of gate lines to which a scan signal is applied are arranged to intersect each other on the first substrate 11. A TFT and a pixel electrode are included in each of a plurality of areas defined by the data lines and the gate lines.

The second substrate 31 includes a plurality of color filters 37 which are respectively formed in a plurality of pixels by a black matrix 35, an overcoating layer that planarizes the color filters 37, and a common electrode that is a counter electrode of the pixel electrode formed on the first substrate 11.

A certain cell gap is maintained between the first substrate 11 and the second substrate 31 by a spacer, and the first substrate 11 is bonded to the second substrate 31 by a seal pattern 61 which is formed along an outer portion of the display area DA.

Moreover, a ground line 15 which overlaps the black matrix 35 of the second substrate 31 is designed in the bezel area BA of the first substrate 11. In this case, the ground line 15 is connected to the driving circuit (drive-IC) 70 and is connected to a ground 90 of a main system through a main flexible printed circuit (FPC).

Therefore, the ground line 15 discharges, through the main system, an electric damage applied from the outside. That is, the ground line 15 is connected to the ground 90 of the main system through the main FPC 70, thereby blocking a surge of static electricity which externally occurs.

However, as described above, the ground line 15 has a function of blocking static electricity which occurs in the first substrate 11, but cannot block static electricity which occurs in the second substrate 31. That is, as illustrated in FIG. 3, a path which causes surge static electricity 80 applied from the outside to be discharged through the ground line 15 is not formed in the second substrate 31, and the surge static electricity flows into the black matrix 35.

As described above, in the related art LCD device, since a distance from an end of the liquid crystal display panel to the ground line is long, the black matrix and the overcoating layer are first damaged.

For this reason, since an electric charge flows into the black matrix, a gate drive-IC in panel (GIP) circuit cannot operate, the liquid crystal display panel is put in a non-driving state, and/or the electric charge flows into the overcoating layer and the display area, causing a smear.

Moreover, since the ground line 15 included in the first substrate 11 is covered by a passivation layer, it is difficult to discharge, through the ground line 15, surge static electricity applied from the outside.

Therefore, in order to fundamentally prevent external surge static electricity from flowing into the liquid crystal display panel 10, a structure for preventing external surge static electricity from flowing into the liquid crystal display panel 10 is provided on the second substrate 31 separately from the first substrate 11.

SUMMARY OF THE DISCLOSURE

Therefore, an aspect of the detailed description is to provide an LCD device, which includes a dually designed black matrix and thus prevents surge static electricity from flowing into a panel, and a method of manufacturing the same.

To achieve these and other advantages and in accordance with the purpose of this specification, as embodied and broadly described herein, an LCD device includes: a first substrate and a second substrate bonded to each other, a display area and a bezel area surrounding the display area being defined therein; an inner black matrix and an outer black matrix disposed in the bezel area of the second substrate to be spaced apart from each other; and a liquid crystal layer disposed between the first substrate and the second substrate.

In the LCD device, a certain gap may be formed between the inner black matrix and the outer black matrix.

In the LCD device, the inner black matrix and the outer black matrix may be disposed on the second substrate to surround the display area.

The LCD device may further include a ground line disposed in the bezel area of the first substrate.

In the LCD device, the ground line of the first substrate may be disposed to surround the display area of the first substrate.

In another aspect of the present invention, an LCD device includes: a first substrate and a second substrate bonded to each other, a display area and a bezel area surrounding the display area being defined therein; a ground line disposed in the bezel area of the first substrate; an inner black matrix and an outer black matrix disposed in the bezel area of the second substrate to be spaced apart from each other; and a liquid crystal layer disposed between the first substrate and the second substrate.

In the LCD device, a certain gap may be formed between the inner black matrix and the outer black matrix.

In the LCD device, the inner black matrix and the outer black matrix may be independently spaced apart from each other with a certain gap therebetween.

In the LCD device, the inner black matrix and the outer black matrix may surround the display area of the second substrate.

In the LCD device, the ground line may be disposed to surround the display area of the first substrate.

In another aspect of the present invention, a method of manufacturing an LCD device includes: providing a first substrate and a second substrate, a display area and a bezel area surrounding the display area being defined in the first substrate and the second substrate; forming a thin film transistor (TFT) on the first substrate; forming a pixel electrode, electrically connected to the TFT, on the first substrate; forming an inner black matrix and an outer black matrix which are disposed in the bezel area of the second substrate face-bonded to the first substrate to be spaced apart from each other; and forming a liquid crystal layer disposed between the first substrate and the second substrate.

In the method of manufacturing the LCD device, the inner black matrix and the outer black matrix may be independently formed to be spaced apart from each other with a certain gap therebetween.

In the method of manufacturing the LCD device, the inner black matrix and the outer black matrix may be formed to surround the display area of the second substrate.

In the method of manufacturing the LCD device, the inner black matrix and the outer black matrix may be simultaneously formed.

The method of manufacturing the LCD device may further include forming a ground line in the bezel area of the first substrate.

In the method of manufacturing the LCD device, the ground line of the first substrate may be disposed to surround the display area of the first substrate.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, some embodiments of the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

In describing the elements of the present invention, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. In the same context, it will be understood that when an element is referred to as being "on" or "beneath" another element, the element can be directly on the other element or indirectly formed with an intervening element therebetween.

Figure 4:
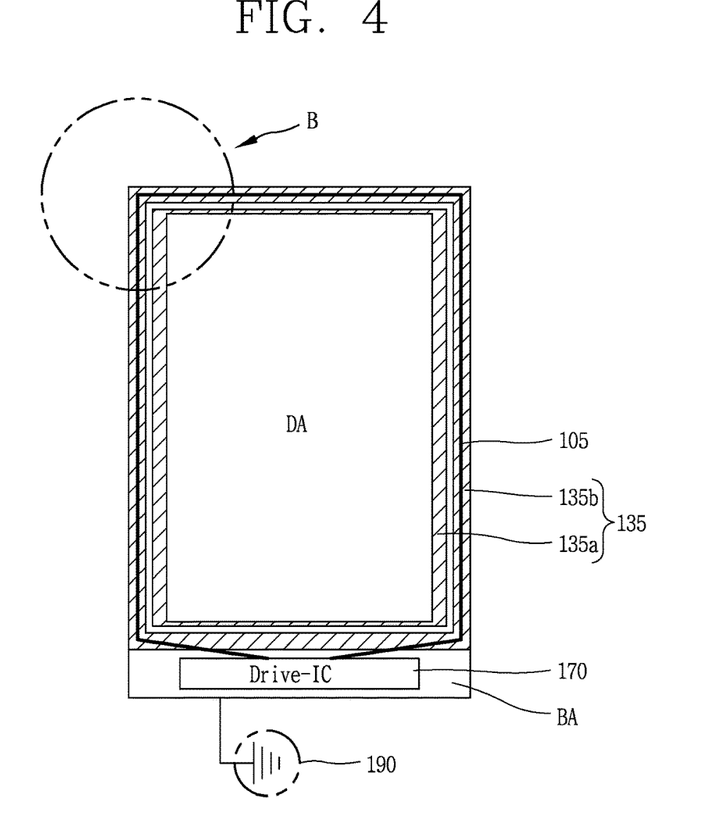
FIG. 4 is a schematic plan view of an LCD device according to an embodiment of the present invention.
Figure 5:
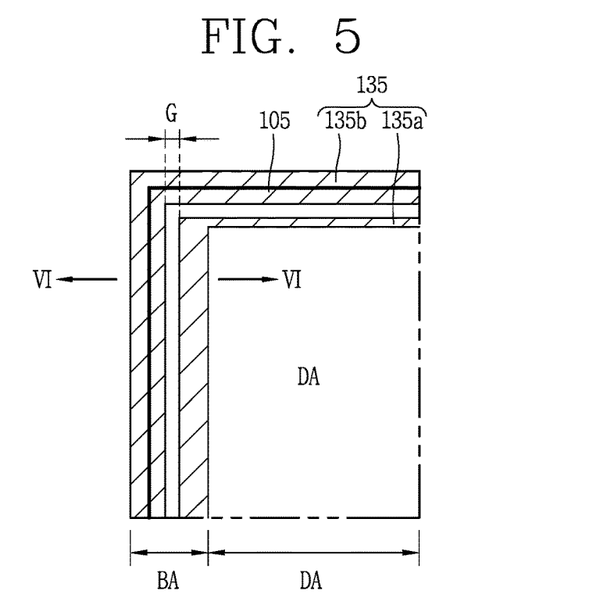
FIG. 5 is an enlarged plan view of a portion B of FIG. 4.

FIG. 4 is a schematic plan view of an LCD device according to an embodiment of the present invention. FIG. 5 is an enlarged plan view of a portion B of FIG. 4. All the components of the LCD device according to all the embodiments of the present invention are operatively coupled and configured.

The LCD device according to an embodiment of the present invention, as illustrated in FIGS. 4 and 5, may include a display area DA, which displays an image, and a bezel area BA that is defined in a form of surrounding a circumference of the display area.

The LCD device, as illustrated in FIGS. 4 and 5, may include a liquid crystal display panel (e.g. see 100 of FIG. 6), where a plurality of liquid crystal cells are arranged in a matrix type, and a plurality of driving circuits 170 for driving the liquid crystal display panel 100.

A black matrix, including an inner black matrix 135a and an outer black matrix 135b which are spaced apart from each other, may be included in the bezel area BA disposed outside the display area DA. In this case, the inner black matrix 135a may be spaced apart from the outer black matrix 135b with a certain gap G therebetween. The inner black matrix 135a may contact the display area DA, and the outer black matrix 135b may contact an outer portion of a panel. Also, the inner black matrix 135a and the outer black matrix 135b may be formed to surround the display area DA.

Moreover, a ground line 105 may be included in the inner black matrix 135a, the outer black matrix 135b, or an area (for example, a first substrate (see 101 of FIG. 6)) overlapping the inner black matrix 135a and the outer black matrix 135b. In this case, the ground line 105 may be connected to the driving circuit (drive-IC) 170 and may be connected to a ground 190 of a main system through a main flexible printed circuit (FPC). However, the ground line 105 may be formed or not depending on the kind of a display device.

The LCD device according to an embodiment of the present invention will be described below in detail with reference to the accompanying drawings.

Figure 6:
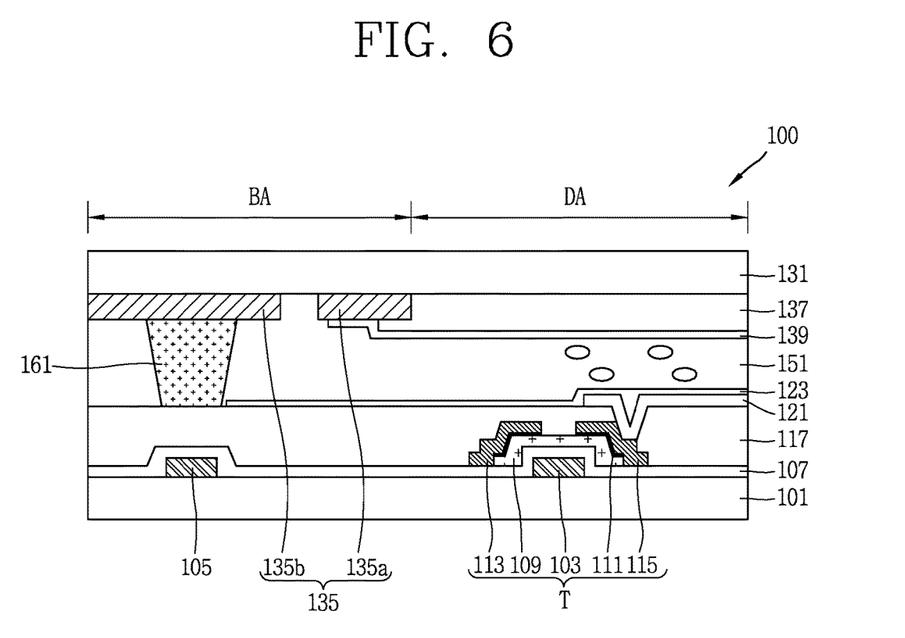
FIG. 6 is a cross-sectional view taken along line VI-VI of FIG. 5 and is a schematic plan view of an LCD device according to an embodiment of the present invention.

FIG. 6 is a cross-sectional view taken along line VI-VI of FIG. 5 and is a schematic plan view of the LCD device according to an embodiment of the present invention.

Referring to FIG. 6, a liquid crystal display panel 100 includes a first substrate 101, where a thin film transistor (TFT) array is formed, a second substrate a31 where a color filter array is formed, and a liquid crystal layer 151 which is formed in the cell gap between the first substrate 101 and the second substrate 131. The first substrate 101 may be bonded to the second substrate 131 to maintain a uniform cell gap.

Moreover, a plurality of data lines to which image information is applied and a plurality of gate lines to which a scan signal is applied are arranged to intersect each other on the first substrate 101. A TFT T and a pixel electrode 123 may be included in each of a plurality of areas defined by the data lines and the gate lines.

To describe this in more detail with reference to FIG. 6, a gate line and a gate electrode 103 extending from the gate line may be formed in a direction toward one side on the first substrate 101 where a display area DA and a bezel area BA surrounding a circumference of the display area DA are defined. In this case, a ground line 105 may be formed in the bezel area BA of the first substrate 101. The ground line 105 may be connected to a driving circuit (drive-IC, e.g., see 170 of FIG. 4) and may be connected to a ground (e.g., see 190 of FIG. 4) of a main system through a main FPC. Therefore, the ground line 105 may be formed in the bezel area BA of the first substrate 101, thereby preventing an electric damage from being applied to a GIP circuit.

Moreover, a gate insulation layer 107 may be formed all over the first substrate 101 which includes a gate electrode 103, the ground line 105, and the gate line.

An active layer 109 and an ohmic contact layer 111 may be stacked on the gate insulation layer 107 on the gate electrode 103.

A source electrode 113 and a drain electrode 115 which are spaced apart from each other may be formed on the active layer 109 and the ohmic contact layer 111. In this case, a data line may extend from the source electrode 113, and the data line may be formed in the other direction intersecting the gate line.

The gate electrode 103, the active layer 109, the source electrode 113, and the drain electrode 115 may configure the TFT T.

Moreover, a passivation layer 117 may be formed all over the first substrate 101 which includes the source electrode 113 and the drain electrode 115. A drain contact hole (e.g., see 119 of FIG. 7E) which exposes a portion of the drain electrode 115 may be formed in a portion of the passivation layer 117.

A pixel electrode 121 electrically connected to the drain electrode 115 may be formed on the passivation layer 117 including the drain contact hole 119.

Moreover, a lower alignment layer 123 may be formed on the passivation layer 117 including the pixel electrode 121.

A black matrix, restricting a pixel area, for image display may be formed in the display area DA of the second substrate 131 which is face-bonded to the first substrate 101, and the black matrix 135 may be formed in the bezel area BA of the second substrate 131. In this case, the black matrix 135 formed in the bezel area BA may include an inner black matrix 135a and an outer black matrix 135b which are spaced apart from each other. Also, the inner black matrix 135a may be spaced apart from the outer black matrix 135b with a certain gap G therebetween. In this case, the certain gap G between the inner black matrix 135a and the outer black matrix 135b may be changed depending on a size of a display device, and thus, a size of the gap G may be adjusted depending on the case. The inner black matrix 135a should be spaced apart from the outer black matrix 135b.

Accordingly, since the inner black matrix 135a and the outer black matrix 135b are formed to be spaced apart from each other with the certain gap G therebetween, surge static electricity (e.g., see 180 of FIG. 4) is prevented from flowing into the display area DA through inner black matrix 135a.

Red, green, and blue color filters 137 may be formed in the display area DA of the second substrate 131, and an overcoating layer for planarizing a substrate surface may be formed on the color filters 137. Also, a common electrode may be formed on the overcoating layer. In this case, the common electrode may be formed on the first substrate 101, based on a liquid crystal driving mode.

An upper alignment layer 139 may be formed on the overcoating layer.

Moreover, a column spacer for uniformly maintaining a cell gap between the first substrate 101 and the second substrate 131 may be formed between the first substrate 101 and the second substrate 131 which are face-bonded to each other, and a liquid crystal layer 151 may be formed in the cell gap between the first substrate 101 and the second substrate 131.

The first substrate 101 may be bonded to the second substrate 131 by a seal pattern 161 along an outer portion of the display area DA.

As described above, in the LCD device according to an embodiment of the present invention, since the inner black matrix and the outer black matrix are formed to be spaced apart from each other with a certain gap therebetween on the upper substrate, surge static electricity is prevented from flowing into the display area through inner black matrix.

Moreover, according to an embodiment of the present invention, since the ground line is formed in the bezel area of the lower substrate, an electric damage cannot be applied to the GIP circuit.

Moreover, according to an embodiment of the present invention, since the inner black matrix and the outer black matrix are spaced apart from each other with a certain gap therebetween, surge static electricity is fundamentally prevented from flowing into the display area through inner black matrix, thereby removing a smear caused by the surge static electricity flowing into the display area.

Moreover, according to an embodiment of the present invention, since one conventional black matrix is divided into the inner black matrix and the outer black matrix which are spaced apart from each other, surge static electricity is blocked even without an outer bezel area of a conventionally designed panel being enlarged.

Moreover, according to an embodiment of the present invention, a damage and a defect caused by surge static electricity are prevented without affecting driving of the liquid crystal display module.

A method of manufacturing an LCD device according to an embodiment of the present invention will now be described with reference to FIGS. 7A to 7H.

FIGS. 7A to 7H are cross-sectional views illustrating a process of manufacturing an LCD device according to an embodiment of the present invention.

Figure 7A:
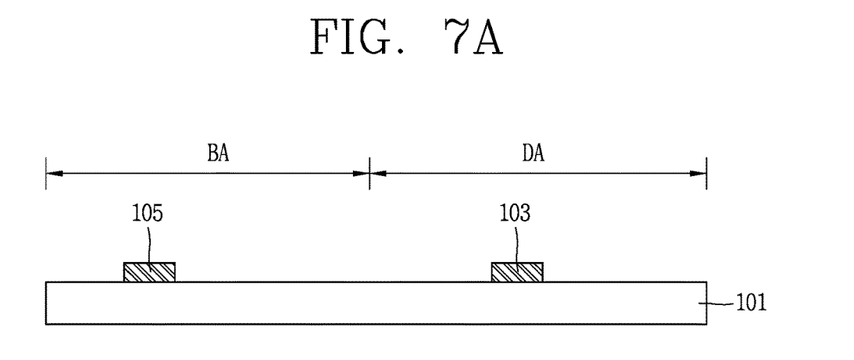
FIGS. 7A to 7H are cross-sectional views illustrating a process of manufacturing an LCD device according to an embodiment of the present invention.

First, a gate metal layer may be formed on a first substrate 101, where a display area DA and a bezel area BA surrounding a circumference of the display area DA are defined, through a deposition process such as a sputtering deposition process or the like. In this case, the gate metal layer may use a single layer structure or a double layer structure including chromium (Cr), molybdenum (Mo), aluminum (Al)-based metal, and/or the like.

Subsequently, as illustrated in FIG. 7A, a gate line, a gate electrode 103 extending from the gate line, and a ground line 105 may be formed by patterning the gate metal layer through a photolithography process and an etching process using a first mask. At this time, patterns such as a common line in a bezel area BA and a common electrode receiving a reference voltage through the common line may be formed in forming the gate line. Also, in a liquid crystal driving mode (for example, a twisted nematic (TN) mode), the common electrode may be formed on a second substrate 131.

The ground line 105 may be formed in the bezel area BA outside a display area DA. The ground line 105 may be connected to a driving circuit (drive-IC, e.g., see 170 of FIG. 4) and may be connected to a ground (e.g., see 190 of FIG. 4) of a main system through a main FPC. However, the ground line 105 may be formed or not depending on the kind of a display device.

Therefore, the ground line 105 may be formed in the bezel area BA of the first substrate 101, thereby preventing an electric damage from being applied to a GIP circuit.

Figure 7B:
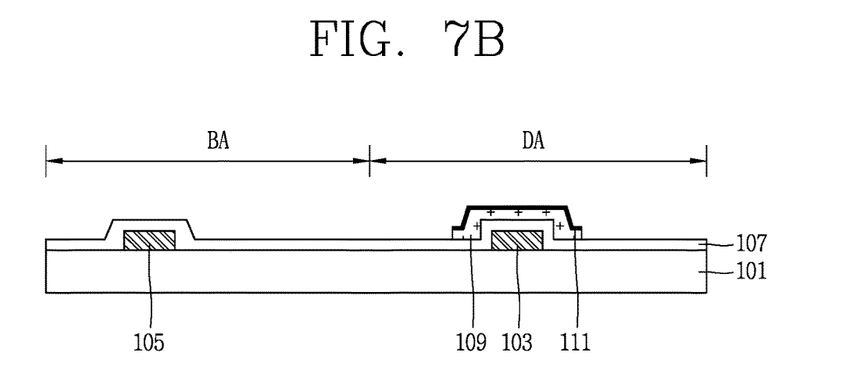

Subsequently, as illustrated in FIG. 7B, a gate insulation layer 107, an amorphous silicon (a-Si) layer, and an n+a-Si layer may be sequentially formed on the first substrate 101, where the patterns are formed, through a deposition process such as a plasma enhanced chemical vapor deposition (PECVD), a sputtering process, and/or the like. In this case, a material of the gate insulation layer 107 may use an inorganic insulating material such as oxide silicon (SiOx), nitride silicon (SiNx), and/or the like.

Subsequently, an active layer 109 and an ohmic contact layer 111 may be formed by patterning the n+a-Si layer and the a-Si layer through a photolithography process and an etching process using a second mask.

Figure 7C:
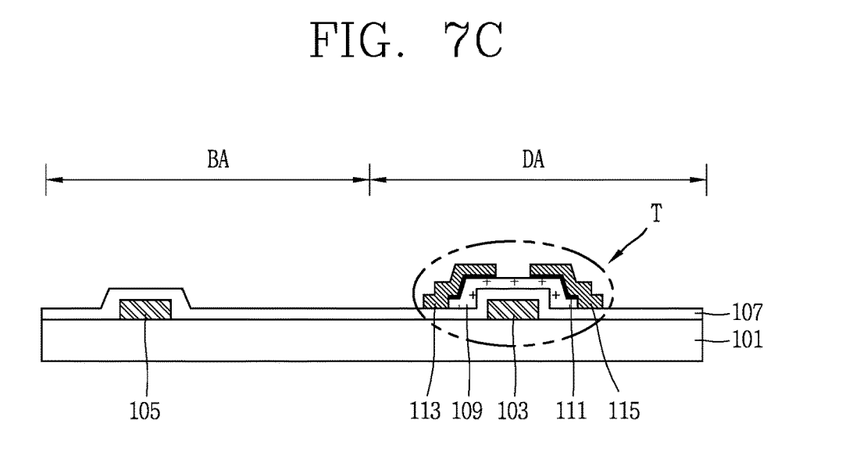

Subsequently, as illustrated in FIG. 7C, a source/drain metal layer may be formed all over the first substrate 101 which includes the ohmic contact layer 111 and the active layer 109, and then, a data line intersecting the gate line, and a source electrode 113 and a drain electrode 115 which are spaced apart from each other may be formed by patterning the source/drain metal layer through a photolithography process and an etching process using a third mask. In this case, the source/drain metal layer may use molybdenum (Mo), titanium (Ti), tantalum (Ta), an Mo alloy, and/or the like. Therefore, the gate electrode 103, the active layer 109, the source electrode 113, and the drain electrode 115 may configure a TFT T.

Figure 7D:
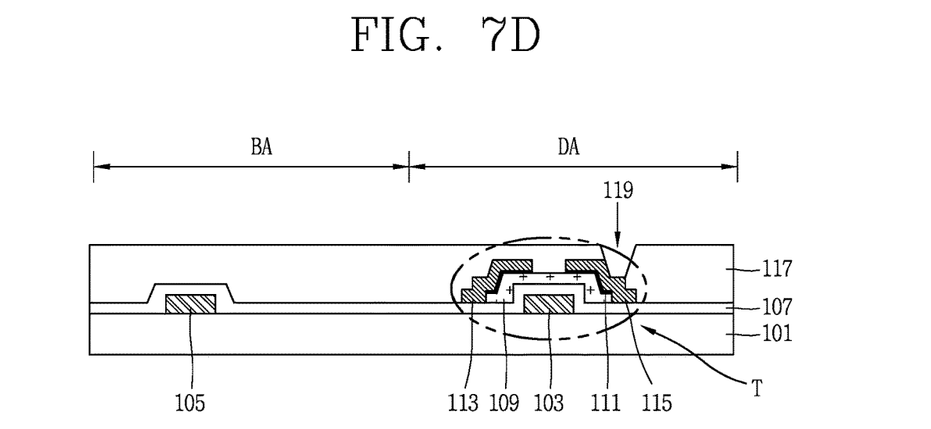

Subsequently, as illustrated in FIG. 7D, a passivation layer 117 may be formed on the gate insulation layer 107, which includes the source electrode 113 and the drain electrode 115, through a deposition process such as a PECVD process and/or the like. In this case, a material of the passivation layer 117 may use an inorganic insulating material such as the gate insulation layer 107, an acryl-based organic compound having a low dielectric constant, or an organic insulating material such as benzo cyclo butane (BCB) or FPCB.

Subsequently, a drain contact hole 119 which exposes a portion of the drain electrode 115 may be formed by patterning the passivation layer 117 through a photolithography process and an etching process using a fourth mask.

Figure 7E:
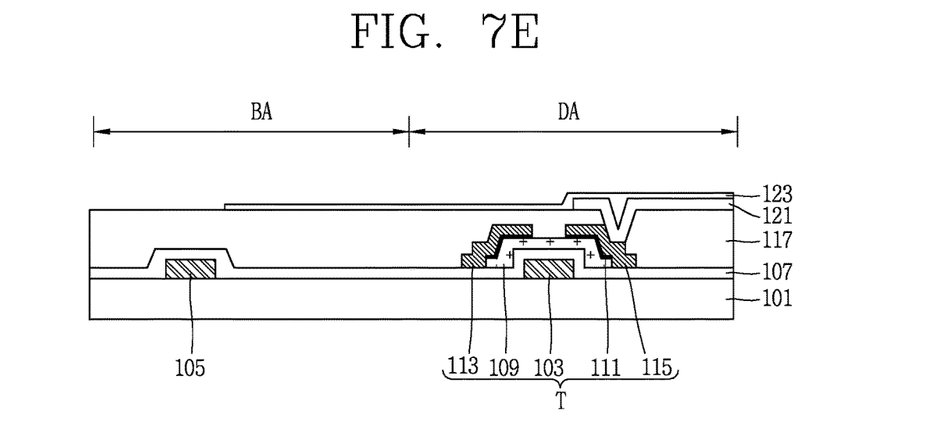

Subsequently, as illustrated in FIG. 7E, a transparent electrode material layer may be deposited on the passivation layer 117 including the drain contact hole 119 through a deposition process such as a sputtering process and/or the like.

Subsequently, a pixel electrode 121 contacting the drain electrode 115 may be formed by patterning the transparent electrode material layer through a photolithography process and an etching process using a fifth mask. In this case, a material of the transparent electrode material layer may use indium tin oxide (ITO), tin oxide (TO), indium zinc oxide (IZO), and/or the like.

In the present embodiment, it is described that the common electrode is formed as a gate metal layer simultaneously with the gate electrode 103 in a first mask process, but the present embodiment is not limited thereto. Depending on the case, the common electrode may be formed of a transparent electrode material simultaneously with the pixel electrode 121 in a fifth mask process.

Subsequently, a lower alignment layer 123 may be formed on the passivation layer 117 including the pixel electrode 121 through rubbing or light alignment.

Figure 7F:
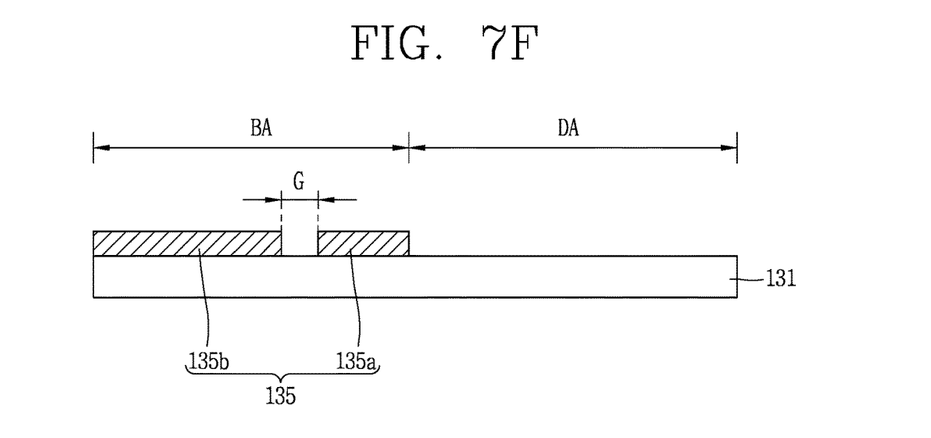

Subsequently, a black matrix layer may be coated on the second substrate 131 which is face-bonded to the first substrate 101. In this case, a material of the black matrix layer may be use Cr, a black resin, and/or the like.

Subsequently, as illustrated in FIG. 7F, a black matrix for defining a plurality of pixel areas may be formed in the display area DA of the second substrate 131 by patterning the black matrix layer through a photolithography process and an etching process using a fifth mask, and a black matrix 135 may be formed in the bezel area BA of the second substrate 131. In this case, the black matrix 135 may include an inner black matrix 135a and an outer black matrix 135b which are spaced apart from each other. Also, the inner black matrix 135a and the outer black matrix 135b may be formed in a form of surrounding the display area DA. Also, the inner black matrix 135a and the outer black matrix 135b may be spaced apart from each other with a certain gap G therebetween.

In this case, the certain gap G between the inner black matrix 135a and the outer black matrix 135b may be changed depending on a size of a display device, and thus, a size of the gap G may be adjusted depending on the case. The inner black matrix 135a should be spaced apart from the outer black matrix 135b.

Accordingly, since the inner black matrix 135a and the outer black matrix 135b are formed to be spaced apart from each other with the certain gap G therebetween, surge static electricity (e.g., see 180 of FIG. 4) is prevented from flowing into the display area DA through inner black matrix 135*a*.

Figure 7G:
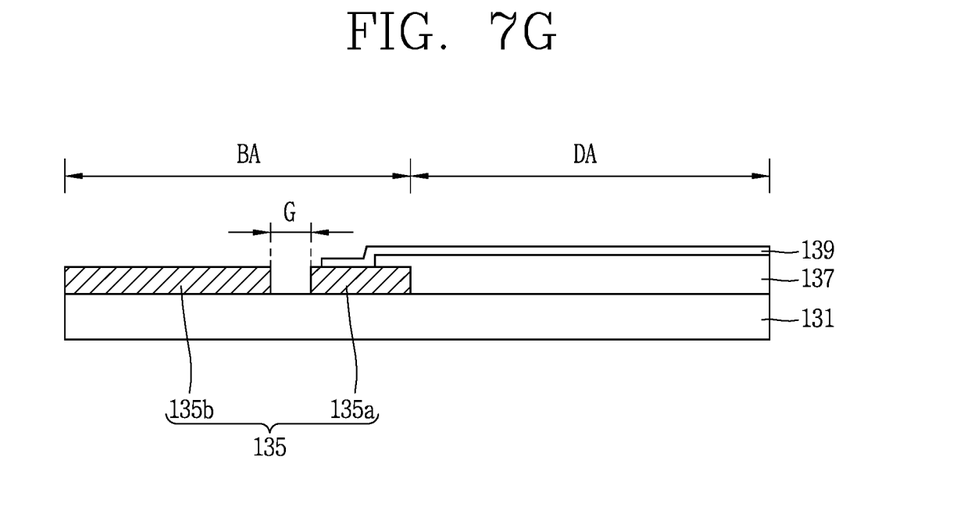

Subsequently, as illustrated in FIG. 7G, a red pigment, a green pigment, and a blue pigment may be sequentially coated on the display area DA of the second substrate 131, and then, red, green, and blue color filters 137 may be formed by patterning a red pigment layer, a green pigment layer, and a blue pigment layer through a photolithography process and an etching process using a mask.

Subsequently, an overcoating layer for planarizing a substrate surface may be formed on the color filters 137.

Subsequently, a common electrode may be formed on the overcoating layer. In this case, the common electrode may be formed on the first substrate 101, based on a liquid crystal driving mode.

Subsequently, a column spacer for uniformly maintaining a cell gap between the first substrate 101 and the second substrate 131 may be formed on the overcoating layer or the common electrode.

Subsequently, an upper alignment layer 139 may be formed on the common electrode or the overcoating layer including the column spacer through rubbing or light alignment.

Figure 7H:
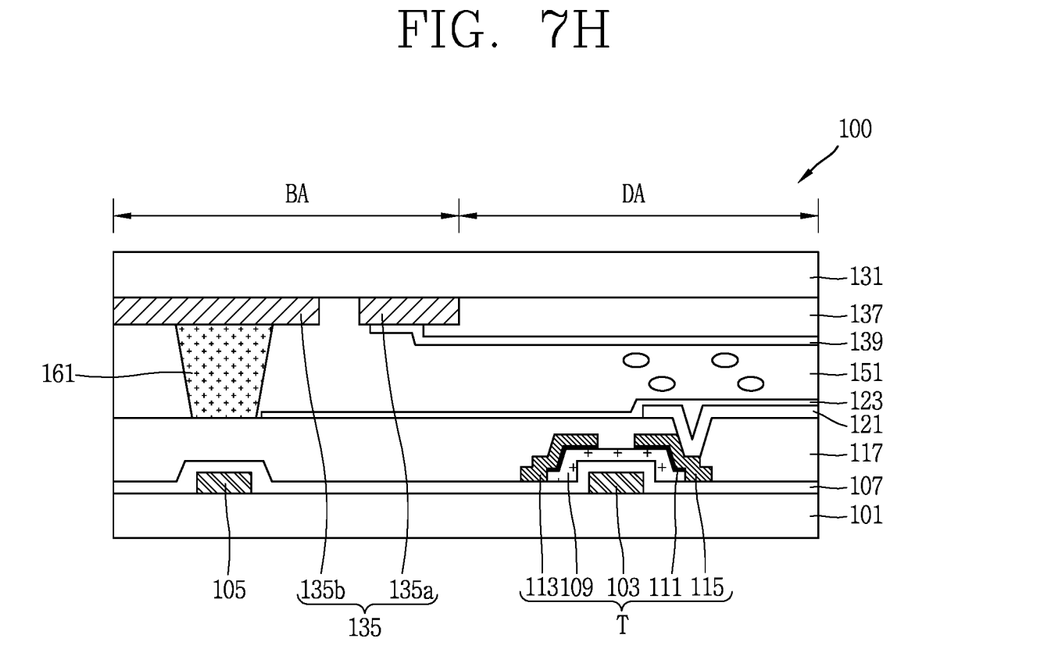

Subsequently, as illustrated in FIG. 7H, a liquid crystal layer 151 may be formed in a cell gap between the first substrate 101 and the second substrate 131 which are face-bonded to each other.

Subsequently, a seal pattern 161 may be formed between the first substrate 101 and the second substrate 131, namely, along an outer portion of the display area DA, and the process of manufacturing the LCD device according to an embodiment of the present invention may be ended by bonding the first substrate 101 to the second substrate 131.

According to the embodiments of the present invention, since the inner black matrix and the outer black matrix are formed to be spaced apart from each other with a certain gap therebetween on the upper substrate, surge static electricity is prevented from flowing into the display area through inner black matrix.

Moreover, according to the embodiments of the present invention, since the ground line is formed in the bezel area of the lower substrate, an electric damage cannot be applied to the GIP circuit.

Moreover, according to the embodiments of the present invention, since the inner black matrix and the outer black matrix are spaced apart from each other with a certain gap therebetween, surge static electricity is fundamentally prevented from flowing into the display area through inner black matrix, thereby removing a smear caused by the surge static electricity flowing into the display area.

Moreover, according to the embodiments of the present invention, since one conventional black matrix is divided into the inner black matrix and the outer black matrix which are spaced apart from each other, surge static electricity is blocked even without an outer bezel area of a conventionally designed panel being enlarged.

Moreover, according to the embodiments of the present invention, since the inner black matrix and the outer black matrix are simultaneously formed in forming a conventional black matrix in a process of manufacturing an LCD device, the number of masks does not increase, or a manufacturing process is not changed. Accordingly, the present invention may be applied to various models.

Moreover, according to the embodiments of the present invention, a damage and a defect caused by surge static electricity are prevented without affecting driving of the liquid crystal display module.

Exemplary embodiments have been described with reference to the accompanying drawings, but the present invention is not limited thereto.

Terms of "comprise" and variations such as "includes", "comprises" or "has" described in this disclosure will be understood to imply the inclusion of stated elements but not the exclusion of any other elements, unless explicitly described to the contrary. Unless indicated otherwise, it is to be understood that all the terms used in the specification, including technical and scientific terms have the same meaning as those that are understood by those skilled in the art to which the present invention pertains. It must be understood that the terms defined by the dictionary are identical with the meanings within the context of the related art, and they should not be ideally or excessively formally defined unless the context clearly dictates otherwise.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A liquid crystal display (LCD) device comprising:
a first substrate and a second substrate bonded to each other, a display area to display an image and a bezel area surrounding the display area being defined therein;
an inner black matrix and an outer black matrix which are disconnected and spaced apart from each other, the inner black matrix and the outer black matrix defining the bezel area and being disposed in the bezel area of the second substrate;
a ground line in the bezel area of the first substrate to surround the display area;
a seal pattern between the first substrate and the second substrate to bond the first substrate and the second substrate; and
a liquid crystal layer disposed between the first substrate and the second substrate,
wherein both of the ground line and the seal pattern are overlapped with the outer black matrix.

2. The LCD device of claim 1, wherein a certain gap is formed between the inner black matrix and the outer black matrix.

3. The LCD device of claim 1, wherein the outer black matrix is disposed on the second substrate to surround the display area.

4. A method of manufacturing a liquid crystal display (LCD) device, the method comprising:
providing a first substrate and a second substrate, a display area to display an image and a bezel area surrounding the display area being defined in the first substrate and the second substrate;

forming a thin film transistor (TFT) on the first substrate;

forming a pixel electrode, electrically connected to the TFT, on the first substrate;

forming an inner black matrix and an outer black matrix which are disconnected and spaced apart from each other, the inner black matrix and the outer black matrix defining the bezel area and being disposed in the bezel area of the second substrate face-bonded to the first substrate;

forming a ground line in the bezel area of the first substrate to surround the display area;

forming a seal pattern on one of the first substrate and the second substrate to bond the first substrate and the second substrate; and forming a liquid crystal layer disposed between the first substrate and the second substrate, wherein both of the ground line and the seal pattern are overlapped with the outer black matrix.

5. The method of claim 4, wherein the inner black matrix and the outer black matrix are independently formed to be spaced apart from each other with a certain gap therebetween.

6. The method of claim 4, wherein the outer black matrix is formed to surround the display area of the second substrate.

7. The method of claim 4, wherein the inner black matrix and the outer black matrix are simultaneously formed.

8. The LCD device of claim 1, further comprising an upper alignment layer on the second substrate and extending towards the outer black matrix, wherein an end of the upper alignment layer terminates before reaching the outer black matrix.

9. The LCD device of claim 8, wherein the end of the upper alignment layer terminates before reaching a certain gap between the inner black matrix and the outer black matrix.

10. The LCD device of claim 8, wherein the certain gap exposes the second substrate.

11. The LCD device of claim 1, wherein the both of the ground line and the seal pattern are overlapped with each other, and with the outer black matrix.

12. The method of claim 4, further comprising:

forming an upper alignment layer on the second substrate to extend towards the outer black matrix, wherein an end of the upper alignment layer terminates before reaching the outer black matrix.

13. The method of claim 12, wherein the end of the upper alignment layer terminates before reaching the certain gap.

14. The method of claim 12, wherein the certain gap exposes the second substrate.

15. The method of claim 4, wherein both of the ground line and the seal pattern are overlapped with each other.

* * * * *